United States Patent [19]
Wong

[11] Patent Number: 6,100,694
[45] Date of Patent: Aug. 8, 2000

[54] MULTIPLE-TUNED BIRD CAGE COILS

[75] Inventor: Wai Ha Wong, San Jose, Calif.

[73] Assignee: Varian, Inc., Palo Alto, Calif.

[21] Appl. No.: 09/256,939

[22] Filed: Feb. 24, 1999

[51] Int. Cl.$^7$ ....................................................... G01V 3/00
[52] U.S. Cl. .......................................... 324/318; 324/322
[58] Field of Search ................................... 324/318, 322, 324/300, 312, 314; 600/422

[56] References Cited

U.S. PATENT DOCUMENTS

| | | | |
|---|---|---|---|
| 5,202,635 | 4/1993 | Srinivasan et al. ...................... | 324/322 |
| 5,212,450 | 5/1993 | Murphy-Boesch et al. ............ | 324/322 |

OTHER PUBLICATIONS

Article by Buess et al., entitled "NQR Detection Using a Meanderline Surface Coil", published in *Journal of Magnetic Resonance* in 1991, vol. 92, pp. 348–362.

Joseph Murphy–Boesch et al., "Two Configurations of the Four–Ring Birdcage Coil for $^1$H–Decoupled $^{31}$P Spectroscopy of the Human Head", *J. Mag. Res.*, Series B 103–114 (1994).

Cecil Hayes et al., "An Efficient, Highly Homogeneous Radiofrequency Coil for Whole–Body NMR Imaging at 1.5", *J. Mag. Res.*, 63, 622–628 (1985).

*Primary Examiner*—Louis Arana

[57] ABSTRACT

A multiple tuned bird cage coil for providing a substantially uniform RF field in a cylindrical sample area of said coil and exhibiting at least two fundamental resonant frequencies comprises a plurality of leg conductors disposed spaced from an axis and at least three rings conductors disposed about the axis and coupled to the leg conductors to define the cylindrical sample area with the leg conductors. The ring conductors and the leg conductors define a low pass bird cage coil that shares a portion of each of the leg conductors with a high pass bird cage coil. A higher frequency current and a lower frequency current flow through the shared portion of each of the leg conductors to provide the substantially uniform RF field in the cylindrical sample area.

22 Claims, 8 Drawing Sheets

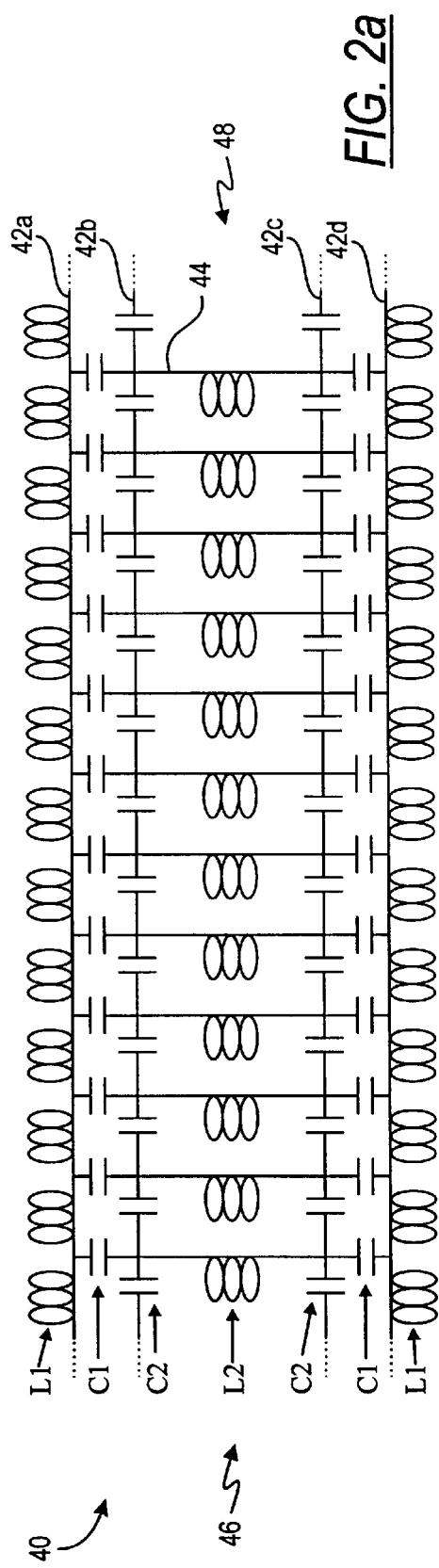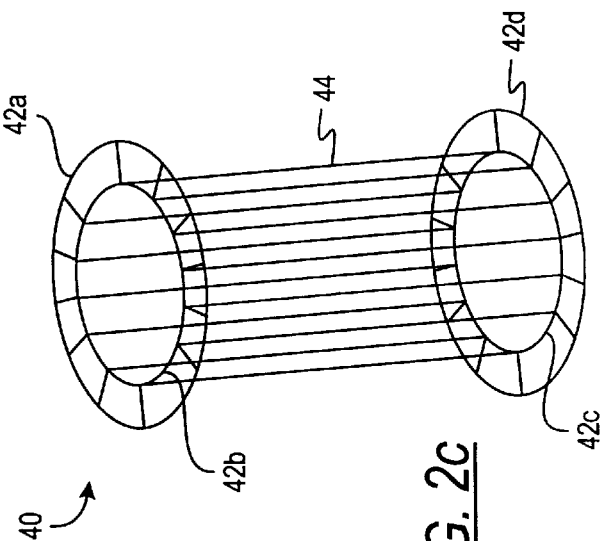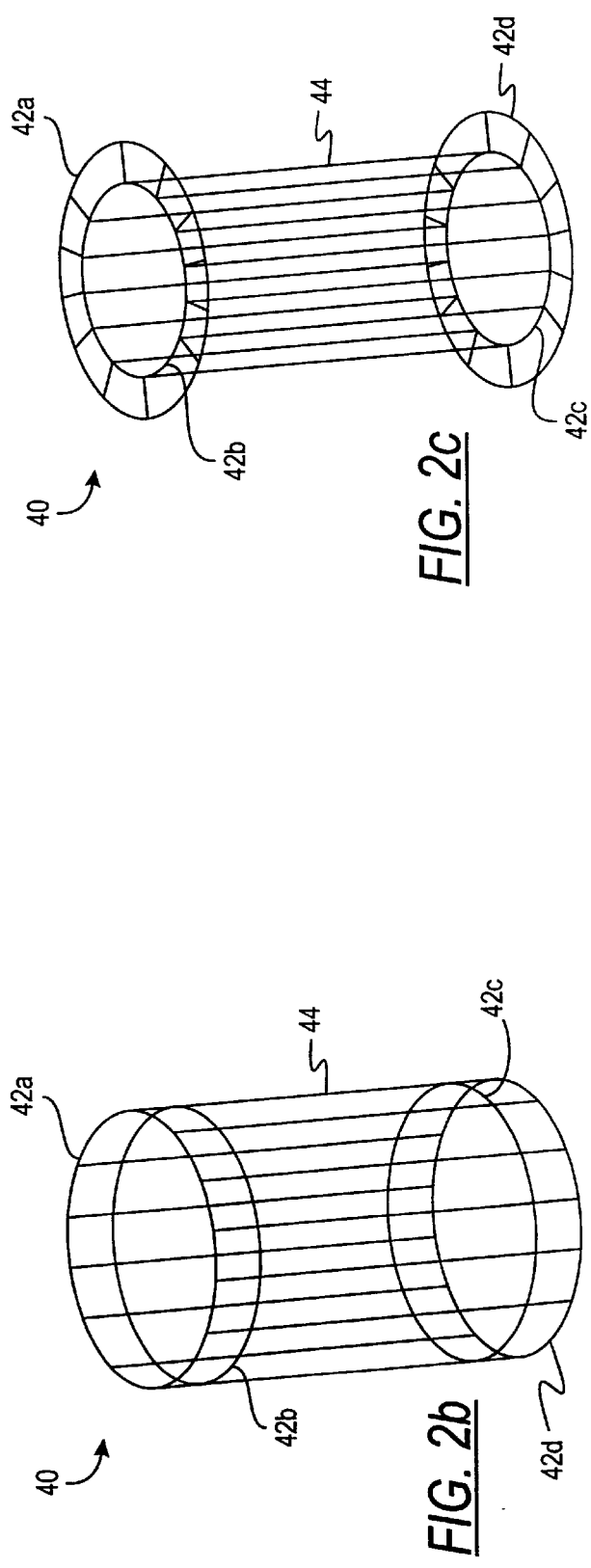

MULTIPLE-TUNED BIRD CAGE COILS

FIELD OF THE INVENTION

The field of the invention is magnetic resonance, and more particularly, RF coils of a bird cage design for the excitation and observation of resonance in a nuclear magnetic resonance apparatus.

BACKGROUND OF THE INVENTION

Magnetic resonance may be used to analyze medical and/or chemical samples. Specifically, the diverse chemical constituents and/or the special distributions of such constituents of the sample may be analyzed through the application of the magnetic resonance phenomena. To implement the magnetic resonance phenomena, RF radiation is applied to the sample by a surrounding structure. The resulting resonant signals are picked-up for analysis by the same or a different surrounding structure. The structure surrounding the sample may be a helical coil, saddle coil, resonant cavity, or a bird cage resonator. The bird cage coil is particularly well suited to large volume samples as are routinely encountered with apparatus for medical imaging and in vivo analytic spectroscopy. Bird cage coils are discussed by Hayes et al, J. Mag. Res., vol. 63, pp. 622–628 (1985).

A bird cage coil is frequently described as a ladder circuit which closes on itself, wherein the current flow around the coil is distributed sinusoidally. It is often asserted that the bird cage coil is essentially a transmission line. As a tuned RF circuit, it is employed in nuclear magnetic resonance ("NMR") apparatus for either or both of the functions of RF excitation and signal detection.

The bird cage coil differs from saddle coil, helices and other structures by its discrete structure that employs phase shifts to provide the proper sinusoidal current distribution. For the bird cage coil, there is a requirement that the phase shift be discretely distributed around the circumference of the coil from zero to $2\pi$ (or $2\pi n$, where n is an integer). The phase shift of each element is quite frequency dependent, and as a consequence, the bird cage coil is tuned at a discrete frequency to achieve the desired phase shift constraint.

As mentioned above, the bird cage structure may be regarded as a periodic structure which closes on itself. Periodic elements of the structure produce phase shifts which must aggregate to some multiple of $2\pi$ when summed over the closed loop. Geometrically, the resonator has cylindrical symmetry, and it is desired that RF current in the axial direction along the periphery of the structure be proportional to $\sin \theta$ where $\theta$ is the azimuthal angle about the cylindrical axis.

To facilitate the study of diverse chemical constituents of the sample, it is desirable to achieve a multiple tuned bird cage coil in order to obtain data at more than one resonant frequency, either concurrently or in separate measurements. Conventional double-tuned bird cage coils attempt to operate at two NMR frequencies, i.e., for two separate nuclei. In a spectroscopic examination, typically images acquired from a proton channel are used to identify the location of interest, and a second channel may be used to tune to the X-nuclei, such as $^3$He, $^{31}$P, $^{129}$Xe, $^{23}$Na or $^{13}$C, for localization spectroscopy or second nuclei imaging. Usually double tuned bird cage coils are preferred over two single tuned bird cage coils because double tuned coils do not require patient repositioning during coils switching, and the double tuned coil provides the option of proton decoupling experiments.

Because bird cage coils are highly symmetric structures, consistency of the components of the coil is essential. A small variation in the value or positioning of one of the components can destroy the uniformity of the magnetic field profile and can complicate the tuning process. Because off-the-shelf commercial inductors typically have a 5% to 10% consistency rating, most conventional double tuned bird cage coils require hand-made solenoid inductors with better consistency ratings. However, the hand-made solenoid inductors are difficult and expensive to construct. Additionally, the hand-made solenoid inductors are difficult to precisely reproduce. Because consistency of the components is essential for bird cage coils, small variation in the value or positioning of the hand-made solenoid inductors can destroy the uniformity of the magnetic field profile and can complicate the tuning process. Another shortcoming of the solenoid inductor is that it generates an intense local magnetic field near its ends. This local field can create undesired effects to the main magnetic field of the bird cage coil.

A conventional double-tuned bird cage coil that does not used lumped inductances or hand-made inductors is discussed by Murphy-Boesch et al, J. Mag. Res., vol. 103, pp. 103–114 (1994). Murphy-Boesch described using different coil lengths to provide two inductance values instead of lumped inductances, namely by providing rings with different lengths. One problem with providing different coil lengths is that the possible lengths of the ring conductor are limited by dimensional limitations, in other words, bird cages can only be so large. The dimensional limitations limit the possible range of inductance values. Additionally, the longer the conductor of the coil, the less concentrated the magnetic field resulting in limited performance. Furthermore, the differing lengths result in a less homogenous field with different field profiles for the low and high resonant frequencies.

Another shortcoming of some conventional double-tuned bird cage coils, including those described by Murphy-Boesch, is the difficulty in tuning the resonant frequencies. Conventional double-tuned bird cage coils have dependent tuning. An example of a double-tuned birdcage coil is described in U.S. Pat. No. 4,916,418, assigned to the assignee of the present invention and incorporated herein by reference. For example, when tuning the bird cage coil to the lower resonant frequency, and inductance values are fixed, adjusting one set of the capacitances on the bird cage coil not only affects the low frequency but also the high frequency. In some double-tuned bird cage coils, at least two different sets of capacitances are in the path of both the low and high frequency currents, so adjusting one set of capacitances affects both low and high resonant frequencies. Thus, the conventional double-tuned bird cage coils are dependently tuned such that more than one set of capacitances on the coil must be adjusted to tune either the lower or higher frequency. Variable capacitors are usually used to tune the resonant frequencies of conventional double-tuned bird cage coils, so significant amounts of time may be required for an iterative tuning procedure.

Thus, it is desired to develop a double-tuned bird cage coil that may be independently tuned to provide a substantially uniform magnetic field. Additionally, it is desired to develop a bird cage coil that minimizes the problems associated with solenoid inductors. Furthermore, it is desired to develop a multiple tuned bird cage coil to provide a substantially uniform magnetic field.

SUMMARY OF THE INVENTION

In accordance with one aspect of the present invention, there is provided an independently, double tuned bird cage coil that provides a substantially uniform magnetic field in a sample space. The double tuned bird cage coil comprises a plurality of leg conductor and at least three ring conductors defining a cylinder surrounding the sample space. The leg conductors and ring conductors form a low pass bird cage coil and a high pass bird cage coil. The low pass bird cage coil shares a portion of each of said leg conductors with said high pass bird cage coil such that both high frequency and low frequency currents pass through the shared portion of each leg conductor to provide a substantially uniform magnetic field in the interior volume of the coil. The high pass bird cage coil comprises a first and a second inner ring of capacitances connected to each other by a leg inductance on the shared portion of each leg. The low pass bird cage coil comprises a first and a second outer ring of inductances connected to each other by the leg conductors each comprising the leg inductance of the shared portion and a leg capacitance. For the independently, doubled tuned bird cage coil with fixed values of inductances, the lower resonant frequency is tuned by only adjusting the leg capacitances, and the higher resonant frequency is tuned by only adjusting the ring capacitances.

In accordance with another aspect of the present invention, there is provided a multiple tuned bird cage coil that provides a substantially uniform magnetic field in a cylindrical sample space. The multiple tuned bird cage coil comprises a plurality of leg conductors disposed spaced from an axis, first and second inner ring conductors and first, second, third and fourth outer ring conductors disposed about the axis and coupled to the leg conductors to define the cylindrical sample area with the leg conductors. The first and second inner ring conductors comprises a series of ring capacitances, and the inner ring conductors are connected to each other by a leg inductance on each of said leg conductors. The first, second, third and fourth outer ring conductor comprise a series of ring inductances. The first outer ring conductor is connected to the first inner ring conductor by a first leg capacitance on each of the said leg conductors, and the second inner ring conductor is connected to the second outer ring conductor by a second leg capacitance on each of the leg conductors. The third outer ring conductor is connected to the first outer ring conductor by a third leg capacitance, and the fourth outer ring conductor is connected to the second outer ring conductor by a fourth leg capacitance.

In accordance with a further aspect of the present invention, there is provided an improved bird cage coil of the type that provides a substantially uniform RF field in a cylindrical sample area of the coil and exhibits at least one fundamental resonant frequency. The bird cage coil contains a plurality of leg conductors and at least two ring conductors coupled to the leg conductors to define the cylindrical sample area, the leg and ring conductors having inductances. The improvement to the bird cage coil comprises a meander line inductor comprising the ring inductance.

BRIEF DESCRIPTION OF THE DRAWINGS

Other aspects and advantages of the invention will become apparent upon reading the following detailed description and upon reference to the drawings.

FIG. 2a is a schematic diagram of the electrical circuit equivalent of one embodiment of the bird cage coil of this invention.

FIG. 2b is a perspective of a single layer structure of the bird cage coil of FIG. 2a.

FIG. 2c is a perspective of a multi-layer structure of the bird cage coil of FIG. 2a.

FIG. 3a is a schematic diagram of the electrical circuit equivalent of the low pass bird cage section of the bird cage coil of FIG. 2a.

FIG. 3b is a schematic diagram of the electrical circuit equivalent of the high pass bird cage section of the bird cage coil of FIG. 2a.

FIG. 4 is a perspective of a zig-zag meander line inductor for use in the bird cage coil of FIG. 2a.

FIG. 5 is a schematic diagram of the art work for the bird cage coil of FIG. 2a.

FIG. 6a is a proton image of a phantom obtained using the bird cage coil of FIG. 2a.

FIG. 6b is a $^{13}$C image of the same phantom used for FIG. 6a.

FIG. 7b is a schematic diagram of the art work for the bird cage coil of FIG. 7a.

Figure 1:
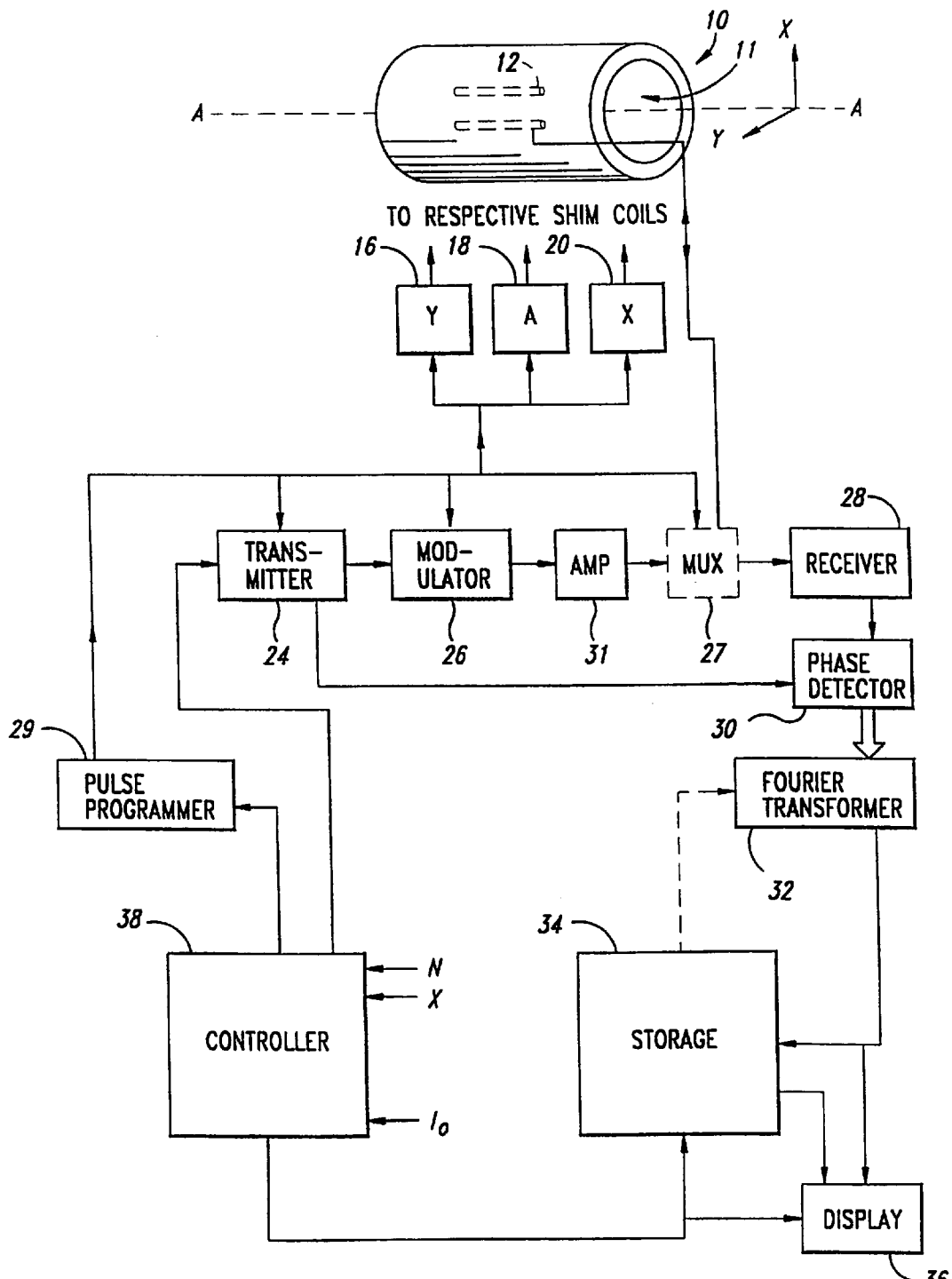
FIG. 1 is a schematic illustration of an NMR apparatus forming the context of the invention.

While the invention is susceptible to various modifications and alternative forms, specific embodiments thereof have been shown by way of example in the drawings and are herein described in detail. It should be understood, however, that the description herein of the specific embodiments is not intended to limit the invention to the particular forms disclosed, but on the contrary, the intention is to cover all modifications, equivalents, and alternatives falling within the spirit and scope of the invention as defined in the appended claims.

DETAILED DESCRIPTION OF THE INVENTION

In general, the physical context of the invention is a bird cage coil apparatus for nuclear magnetic resonance ("NMR") investigations or magnetic resonance imaging ("MRI"). An idealized illustration is shown in FIG. 1.

A magnet 10 having bore 11 provides a main magnetic field. In order to control the magnetic field with precision in time and direction, there are provided magnetic field gradient coils (not shown). The gradient coils are driven by gradient power supplies 16, 18 and 20, respectively. Additionally, other shimming coils (not shown) and power supplies (not shown) may be required for compensating residual undesired spatial inhomogeneities in the basic magnetic field. An object or fluid for analysis (hereinafter "sample") is placed within the magnetic field in bore 11. The sample is subject to irradiation by RF power, such that the RF magnetic field is aligned in a desired orthogonal relationship with the magnetic field in the interior of bore 11. This is accomplished through a transmitter coil 12 in the interior of bore 11. Resonant signals are induced in a receiver coil, proximate the sample within bore 11. The transmitter and receiver coils may be the identical structure, or separate structures.

As shown in FIG. 1, RF power is provided from first transmitter 24a, and is amplified by an amplifier 31 and then directed via multiplexer 27 to the RF transmitter coil 12 located within the bore 11. The transmitter 24 may be modulated in amplitude or frequency or phase or combinations thereof, either upon generation or by a modulator 26. Additional transmitter 24b/modulator 26b components are often employed to independently excite different gyromagnetic resonators, e.g., protons and $C^{13}$. These independent excitations are conveniently supported by a multiply resonant coil as described herein. Transmit and receive functions are not concurrently active. The identical coil may be employed for both functions if so desired. Thus, a multiplexer 27 is provided to isolate the receiver from the transmitter. In the case of separate transmitter and receiver coils, element 27, while not precisely a multiplexer, will perform a similar isolation function to control receiver operation.

The modulator 26 is controlled by pulse programmer 29 to provide RF pulses of desired amplitude, duration and phase relative to the RF carrier at preselected time intervals. The pulse programmer may have hardware and/or software attributes. The pulse programmer also controls the gradient power supplies 16, 18 and 20, if such gradients are required. These gradient power supplies may maintain selected static gradients in the respective gradient coils if so desired.

The transient nuclear resonance waveform is processed by receiver 28 and further resolved in phase quadrature through phase detector 30. The phase resolved time domain signals from phase detector 30 are presented to Fourier transformer 32 for transformation to the frequency domain in accordance with specific requirements of the processing. Conversion of the analog resonance signal to digital form is commonly carried out on the phase resolved signals through analog to digital converter ("ADC") structures which may be regarded as a component of phase detector 30 for convenience.

It is understood that Fourier transformer 32 may, in practice, act upon a stored (in storage unit 34) representation of the phase resolved data. This reflects the common practice of averaging a number of time domain phase resolved waveforms to enhance the signal-to-noise ratio. The transformation function is then applied to the resultant averaged waveform. Display device 36 operates on the acquired data to present same for inspection. Controller 38, most often comprising one or more computers, controls and correlates the operation of the entire apparatus.

The subject matter of the present invention is a special structure for the RF transmit and receive coil 11. Specifically, the present invention is a multiple tuned bird cage coil which can be operated simultaneously at multiple resonant frequencies to provide a substantially uniform RF field within the cylindrical interior of the bird cage. FIG. 2a schematically illustrates the electrical circuit equivalent for a double tuned bird cage coil 40 of one embodiment of the invention, and FIG. 2b illustrates the physical perspective of the double tuned bird cage coil 40 of FIG. 2a. The bird cage coil 40 has four rings or annular conductors 42a, 42b, 42c and 42d and twelve leg conductors 44 forming the cylinder of the bird cage.

Physically as depicted in FIG. 2b, the rings 42a, 42b, 42c and 42d are coaxial and are spaced along the coil axis to form the cylinder of the bird cage. Additionally, the bird cage coil 40 is a single layer structure with the rings 42a, 42b, 42c and 42d having substantially identical diameters. Alternatively as depicted in FIG. 2c, the double tuned bird cage coil 40 may be a multi-layer structure with rings 42a and 42b stacked up on rings 42b and 42d, respectively. For the multi-layer bird cage depicted in FIG. 2c, the rings 42a and 42d have larger diameters than the rings 42b and 42c.

The four rings 42a, 42b, 42c and 42d may be described for convenience as a first outer ring 42a, two inner rings 42b and 42c and a second outer ring 42d. The spacing between the inner rings 42b and 42c is the longitudinal length of the sample area, so this space is typically made as large as possible to accommodate large samples. On the other hand, the space between rings 42a and 42b, and the space between rings 42c and 42d is typically desired to be significantly smaller than the space between the inner rings 42b and 42c.

The leg conductors 44 are substantially parallel to one another to form the boundary of the cylinder of the bird cage. The legs 44 are approximately evenly spaced around the cylinder that they define with the rings 42. Each leg 44 comprises a portion between rings 42a and 42b, a portion between 42b and 42c and a portion between 42c and 42d. In the single layer structure of the bird cage coil 40 as depicted in FIG. 2b, the all portions of the legs 44 are substantially parallel to the longitudinal axis of the coil. In the multi-layer structure of the bird cage coil 40 as depicted in FIG. 2c, only the portions of the legs 44 between 42b and 42c are substantially parallel to the longitudinal axis of the coil. The embodiment of the double-tuned bird cage coil 40 illustrated in FIG. 2a has twelve legs, however any number of legs may be used It is preferred, but not a requirement that the number of legs be a multiple of four, such as 4, 8, 12, 16, 20, 24, 28 or 32, with 12 or 16 being preferred.

FIG. 2a schematically illustrates the electrical circuit equivalent for the double tuned bird cage coil 40 of one embodiment. The left hand side 46 of the circuit folds around to connect to the right hand side 48 of the circuit to form the cylindrical bird cage coil 40 as depicted in FIGS. 2b & 2c. The outer rings 42a and 42d comprise a series of inductances L1 and the inner rings 42b and 42c comprise a series of capacitances C2. Inductances L2 of the shared portion of the legs connect inner ring 42b to inner ring 42c, and capacitances C1 connect outer ring 42a to inner ring 42b and outer ring 42d to inner ring 42c. As illustrated in FIG. 2a, the legs 44 couple to the rings between adjacent inductances L1 on rings 42a and 42d and between adjacent capacitances C2 on rings 42b and 42c. The bird cage coil 40 of FIG. 2a has a balanced design; however, the coil 40 may also have an unbalanced design by replacing the combination of the two rings 42c and 42d connected by the capacitances C1 with a conductor ring to form an unbalanced three ring bird cage.

Figure 3A:
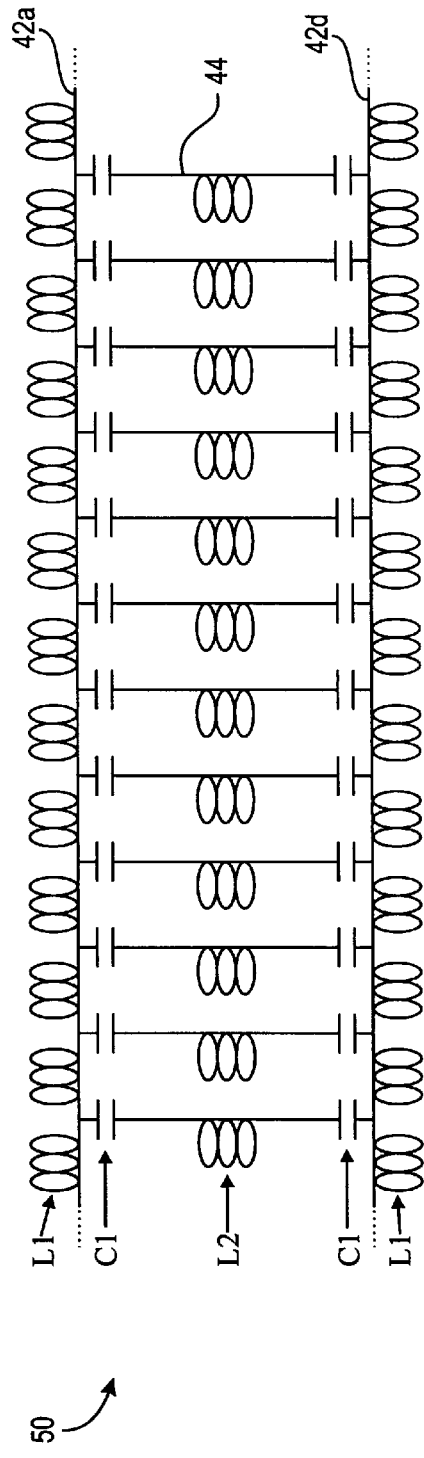
Figure 3B:
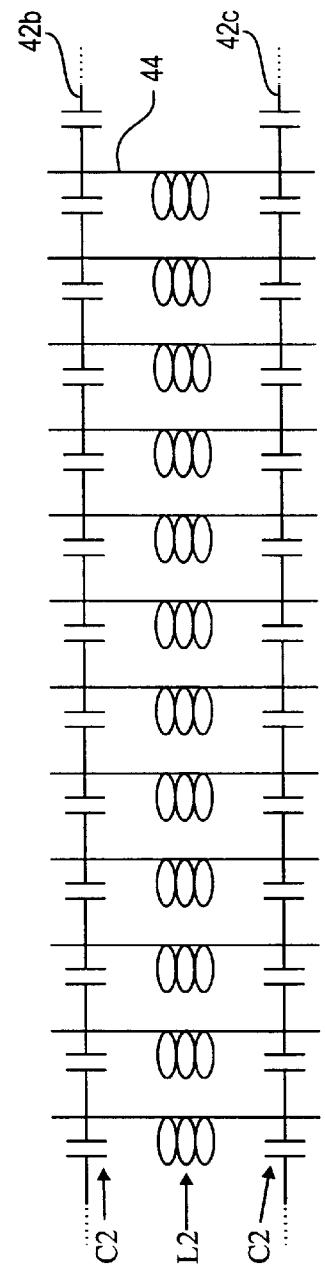

The double tuned bird cage coil 40 of FIG. 2a can be understood as the combination of a low pass bird cage 50 as illustrated in FIG. 3a and a high pass bird cage 52 as illustrated in FIG. 3b. The low pass bird cage 50 comprises the two outer rings 42a and 42d which each comprise the series inductances L1 and the legs 44 which each comprise the series combination of capacitance C1, inductance L2, and capacitance C1. In the embodiment depicted in FIGS. 2a and 3a, the low pass bird cage 50 has two capacitances C1 which help balance the circuit as well as reduce the voltage across each capacitor to reduce the likelihood of arcing. Alternatively, the low pass bird cage may be unbalanced with the legs 44 each comprising the series combination of capacitance C1 and inductance L2 which eliminates one of the capacitances C1 between the outer and inner rings 42a and 42b or 42c and 42d. The low pass bird cage is tuned to the lower resonant frequency by selecting the proper value of C1. It may be shown that the resonant frequency for the low pass bird cage of FIG. 3a satisfies the relationship:

$$\omega_{Low}=[LC_1]^{-1/2}\sin(k\pi/N)$$

where k is an integer for the general case and N=number of legs. L depends upon both L, and $L_2$, the coupling between adjacent legs and general coil dimensions. For the present invention, only the mode k=1 need be considered. When tuned to the lower resonant frequency, low frequency currents flow through the inductance L2 on the shared portions of legs 44.

As illustrated in FIG. 3b, the high pass bird cage 52 comprises the two inner rings 42b and 42c which each comprise the series of capacitances C2 and a shared portions of the legs 44 comprising the inductance L2. The high pass bird cage 52 is tune to the higher resonant frequency by selecting the proper value of C2. It may be shown that the resonant frequency for the high pass bird cage of FIG. 3b satisfies the relationship:

$$\omega_{High} = [L'C_2]^{-\frac{1}{2}} \sin(k\pi/N)$$

where L' is a function of $L_2$, the coil dimensions, and the coupling between legs $L_2$, but having no dependence on L1. When tuned to the high resonant frequency, high frequency currents flow through the inductance L2 on the shared portions of legs 44.

For selected values of the inductance L1 and L2, the k=1 mode of the low pass bird cage 50, which has a substantially homogeneous magnetic field in the sample space, is determined only by the value of the capacitance C1. Additionally, for the selected values of inductance L1 and L2, the k1 mode of the high pass bird cage, which has a substantial homogeneous magnetic field in the sample space, is determined only by the value of capacitance C2. Thus, the double tuned bird cage coil 40 of this invention provides independent tuning of the low and high resonant frequencies. That is, adjusting the C1 value affects only the lower frequency and does not effect the high frequency. Similarly, adjusting the C2 value affects only the higher frequency and does not affect the lower frequency. The independent tuning of the double tuned bird cage coil 40 provides a significant advantage over the conventional prior art double tuned bird cage coils which typically have dependent tuning. When one set of the capacitors of the conventional double tuned bird cage coil is adjusted to tune the lower frequency, this adjusted capacitance also affects the higher frequency. Similarly, when one set of the capacitors of the conventional double tuned bird cage coil is adjusted to tune the higher frequency, the adjusted capacitance also affects the lower frequency.

The independent multiply tuned bird cage coil 40 of the present invention simplifies the design of bird cage coils. The coils may be designed one resonant frequency at a time by only varying one component. To allow the end user to tune the bird cage coil, variable capacitors rather than fixed value capacitors may be used in bird cage coil 40. This allows the user to easily tune one of the frequencies by adjusting one of the variable capacitors C1 or C2. The independently tuned bird cage coil 40 also simplifies the optimization process for a coil for selecting inductance values L1 and L2.

Figure 4:
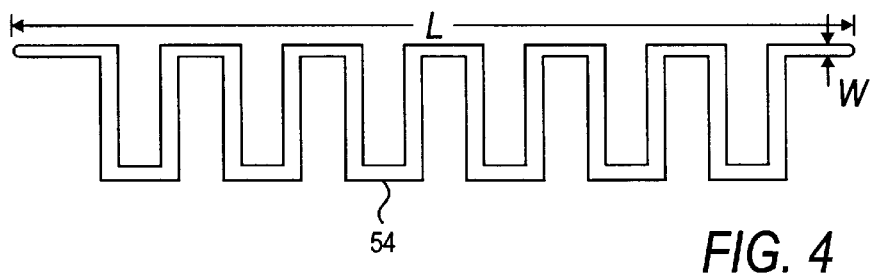

For one embodiment of the double tuned bird cage coil 40 illustrated in FIG. 2a, the inductance L1 is a meander line inductor 54 as illustrated in FIG. 4. The meander line inductance L1 of FIG. 4 preferably has a zig-zag pattern; however, other patterns may be used to provide a longer length of conductor for a shorter physical limiting dimension. As known to one of ordinary skill in the art, the inductance value of the zig-zag meander line inductor is a function of the number of turns for a given length and the width of the meander line. Typically, the thickness of the meander line is negligible relative to the width and length of the meander line; for example, a typical thickness would be about ten times less than the width of the meander line. The meander line comprises an electrical conductor such as copper, gold, silver or any appropriate conducting material.

One advantage of the meander line inductor 54 is that the zig-zag meander line patterns can be easily manufactured to precision by machining or etching using standard circuit board technology. The zig-zag meander line inductor provides a consistent inductance array, usually with a rating consistency greater than 1%. In contrast, the hand-made solenoid inductors used in conventional bird cage coils are difficult to precisely construct. Because the bird cage coil requires a highly symmetrical structure, the consistency of the components is very important; a small variation in value or in the positioning of the components can destroy the uniformity of the magnetic field profile and complicates the tuning process. Because hand-made solenoids are difficult to consistently reproduce, the uniformity of the magnetic field profile suffers and the tuning process of conventional bird cage coils is complicated and iterative.

Another advantage of the meander line inductor 54 is its design flexibility. The inductance value of the meander line inductor 54 may be varied simply by changing the width and number of zig-zags for a given length which is extremely valuable for limited space applications such as coil design. Additionally, the meander line inductor 54 spreads out its inductor-related-resistance along its entire length which reduces local heating during RF pulses.

The zig-zag pattern of the meander line inductor 54 also provides an advantage over the conventional solenoid inductors by canceling the effect of the undesired local magnetic field produced by solenoid inductors. A solenoid inductor generates an intense local magnetic field near its ends. This local field can create an undesired magnetic field. Although solenoids can be arranged to be orthogonal to the main field of the bird cage coil, this arrangement is difficult in application, and a local field component parallel to the main bird cage coil field will be present due to the end effect. In contrast, the meander line inductor 54 with its zig-zag pattern forces current to flow in the opposite direction from the adjacent paths. This arrangement cancels out the undesired local field to the first order. The meander line inductor 54 also acts as a distributed inductor by spreading out its local magnetic field over its entire length so that the local magnetic field is uniform along its entire length. The combination of these two effects makes the meander line inductors 54 more preferred in a bird cage coil construction than solenoid inductors. In an alternative embodiment, the inductance L1 may be provided by lumped inductors such as hand-made solenoids or line inductors comprising a conducting wire.

Figure 5:
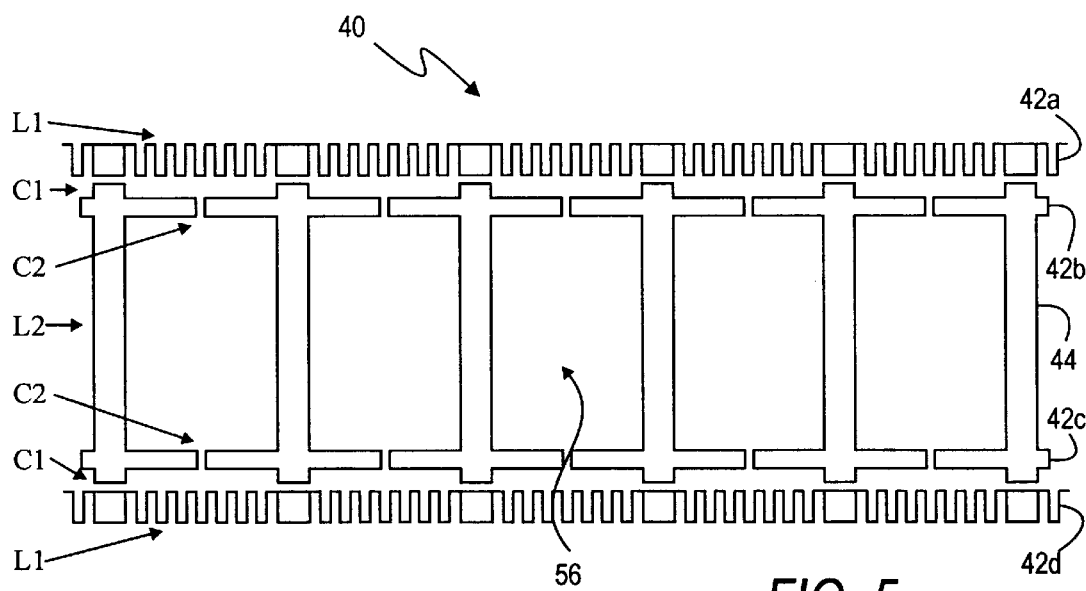

For one embodiment of the double tuned bird cage coil 40 illustrated in FIG. 2a, the inductance L2 is a line inductance with a rectangular shape as illustrated in FIG. 5 incorporating the meander line inductance of FIG. 4. FIG. 5 depicts a portion of the art work of the double tuned bird cage coil 40. The bird cage coil 40 may be easily manufactured by etching using standard circuit board technology. The inductance value for the inductance L2 is determined by the length and width of the rectangle. As to one of ordinary skill in the art, the inductance value of the rectangular shape conductor is a function of the length and width of the rectangle. As with the meander line inductor L1, the thickness of the inductance L2 is negligible relative to the width and length of the inductance L2. The inductance L2 comprises an electrical conductor such as copper, gold, silver or any appropriate conducting material. In an alternative embodiment, the inductance L2 may also be provided by a meander line inductances or lumped inductors such as hand-made solenoids.

The current flow in the double tuned bird cage coil 40 flows through inductance L2 of the shared portion of legs 44 and creates a substantially uniform magnetic field in the sample area 56. Since both high and low frequency currents will flow through L2, a substantially identical magnetic field profile is produced for both high and low frequencies. For the art work illustrated in FIG. 5, all corners should be rounded to reduce possible current crowding and arcing.

An example double tuned bird cage coil of the above description of FIGS. 2a & 2b was constructed. The value of capacitance for C1 was approximately 68 pf and C2 was approximately 9.1 pf. For this purpose, ceramic chip capacitors having an accuracy of about 1% have been employed. The inductances L2 were each provided by a length of approximately 4.5 inches of rectangular shaped copper wire having a width of approximately 0.5 inches. The inductances L1 were each provided by a copper zig-zag meander line inductor having four turns, a length of approximately ⅛ inch per zig-zag or approximately 0.5 inch total length and a width of approximately 1/32 inch. In overall dimensions, the bird cage coil was approximately 11.5 cm in length with a diameter of approximately 10 cm.

Figure 6A:
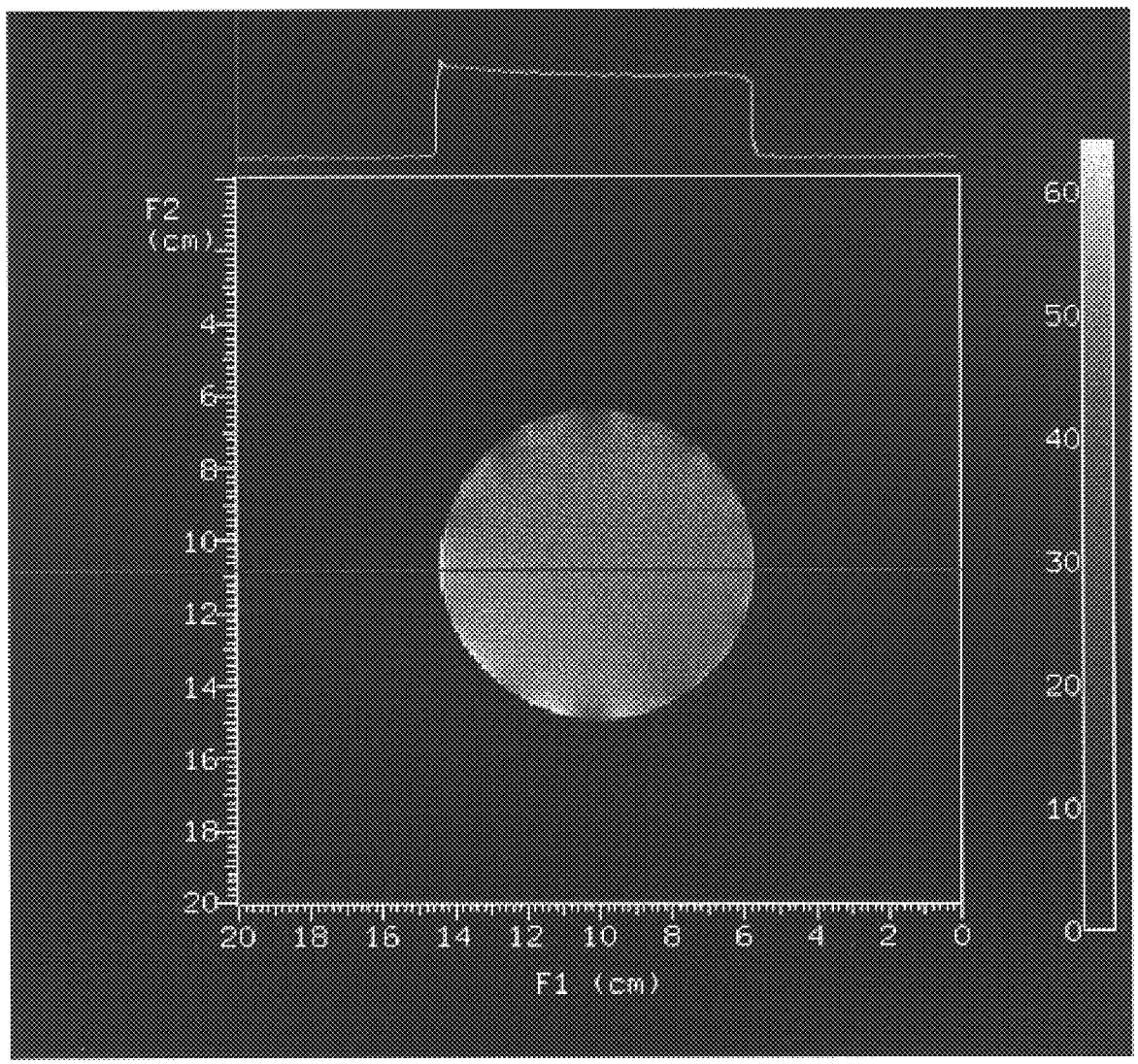
Figure 6B:
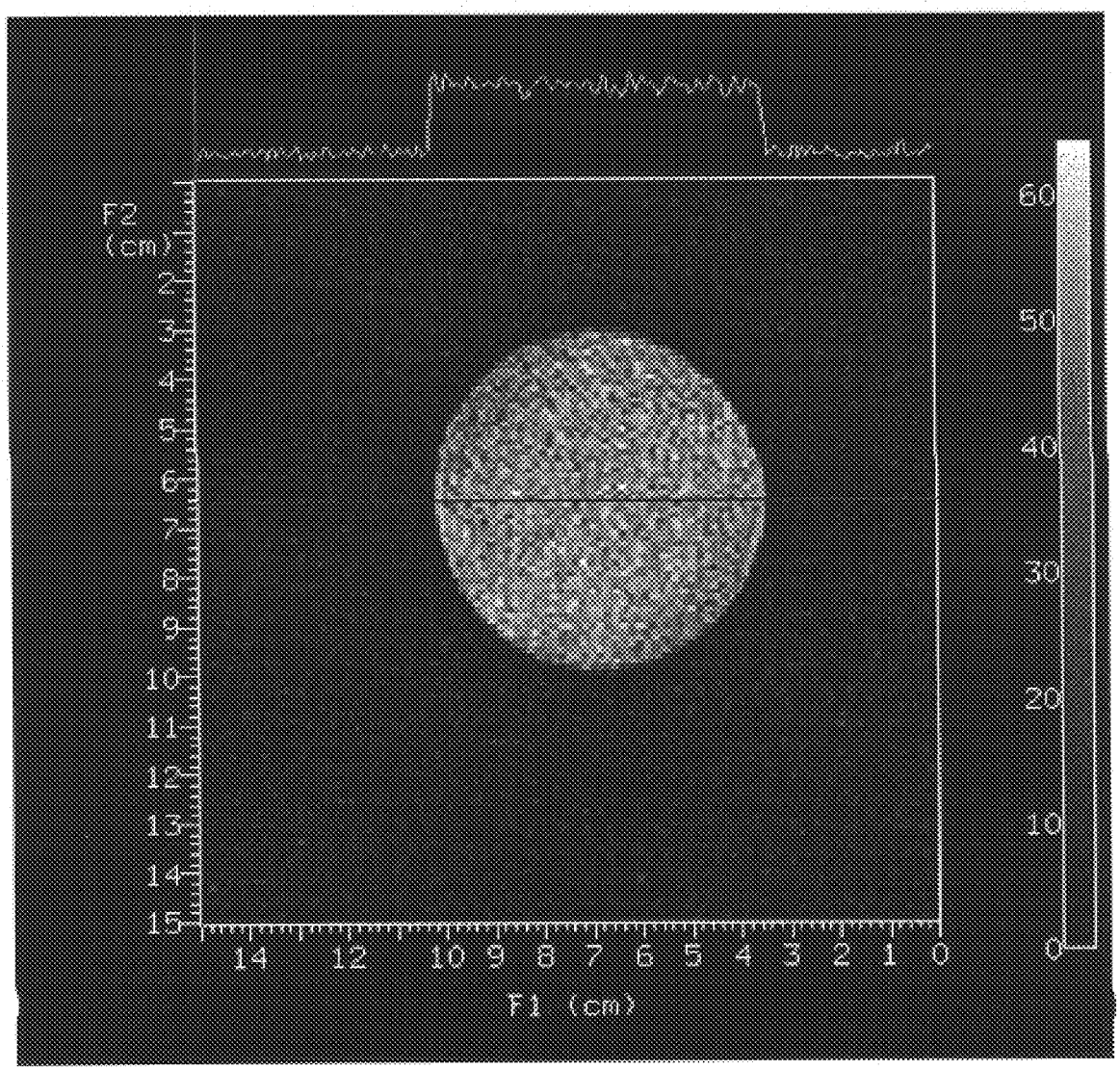

With this example of the double tuned bird cage coil 40, the high frequency fundamental mode resonance occurs at about 200 MHz and the low frequency fundamental mode occurs at about 50.3 MHz. These frequencies were selected for proton and carbon resonances appropriate to a 4.7 Telsa magnetic field. A phantom was constructed of a carbon sample placed within the sample area of the bird cage coil 40. The resulting images at 200 MHz and 50.3 MHz are shown respectively at FIGS. 6a and 6b. Cuts were taken through the two parameter data at the values indicated by the arrows on each axis at each fundamental mode frequency. These are displayed on the corresponding axes and demonstrate that the field within the bird cage coil is substantially uniform.

Figure 7A:
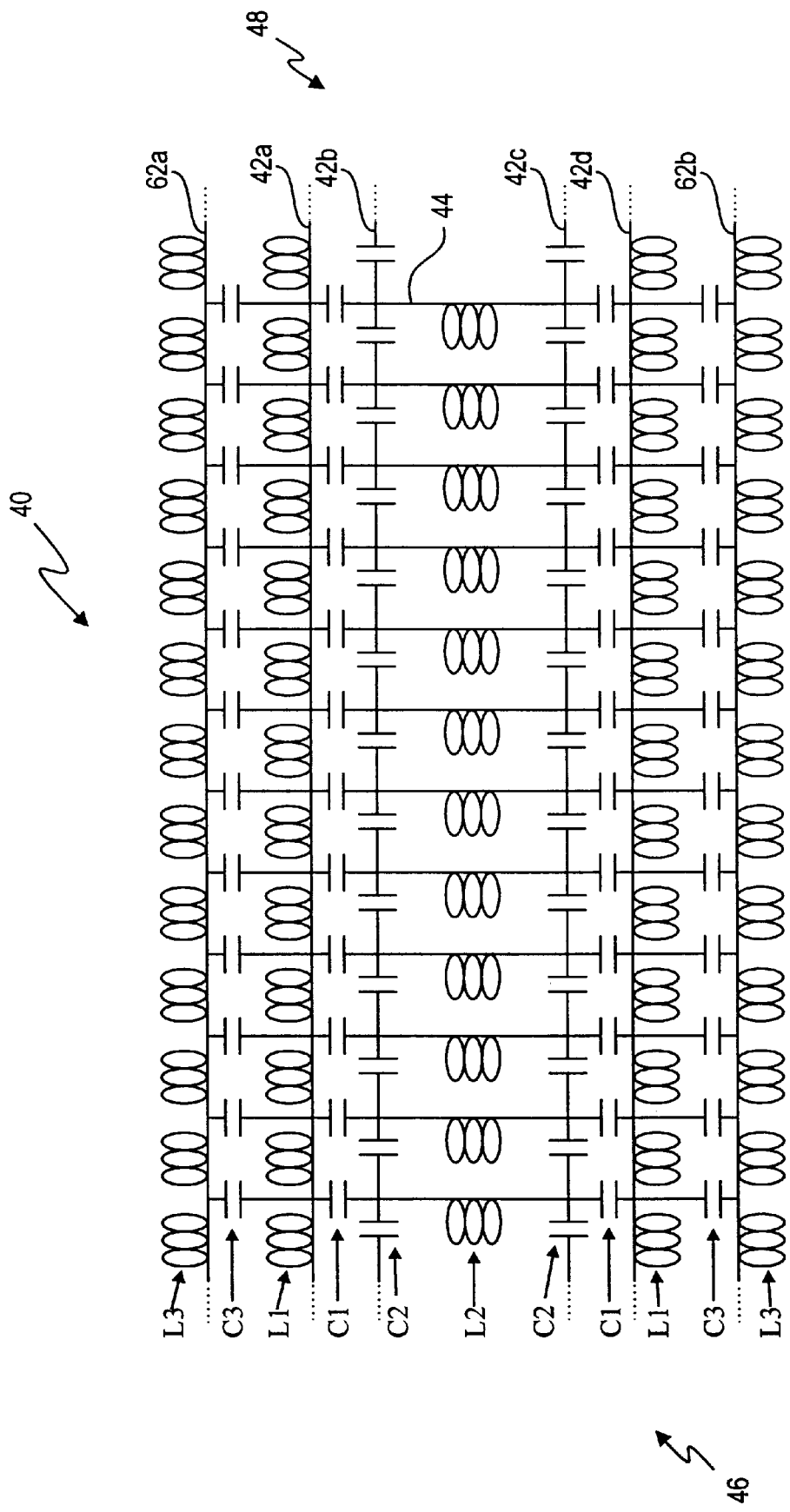
FIG. 7a is a schematic diagram of the electrical circuit equivalent of a triple resonant embodiment of the bird cage coil of this invention.
Figure 7B:
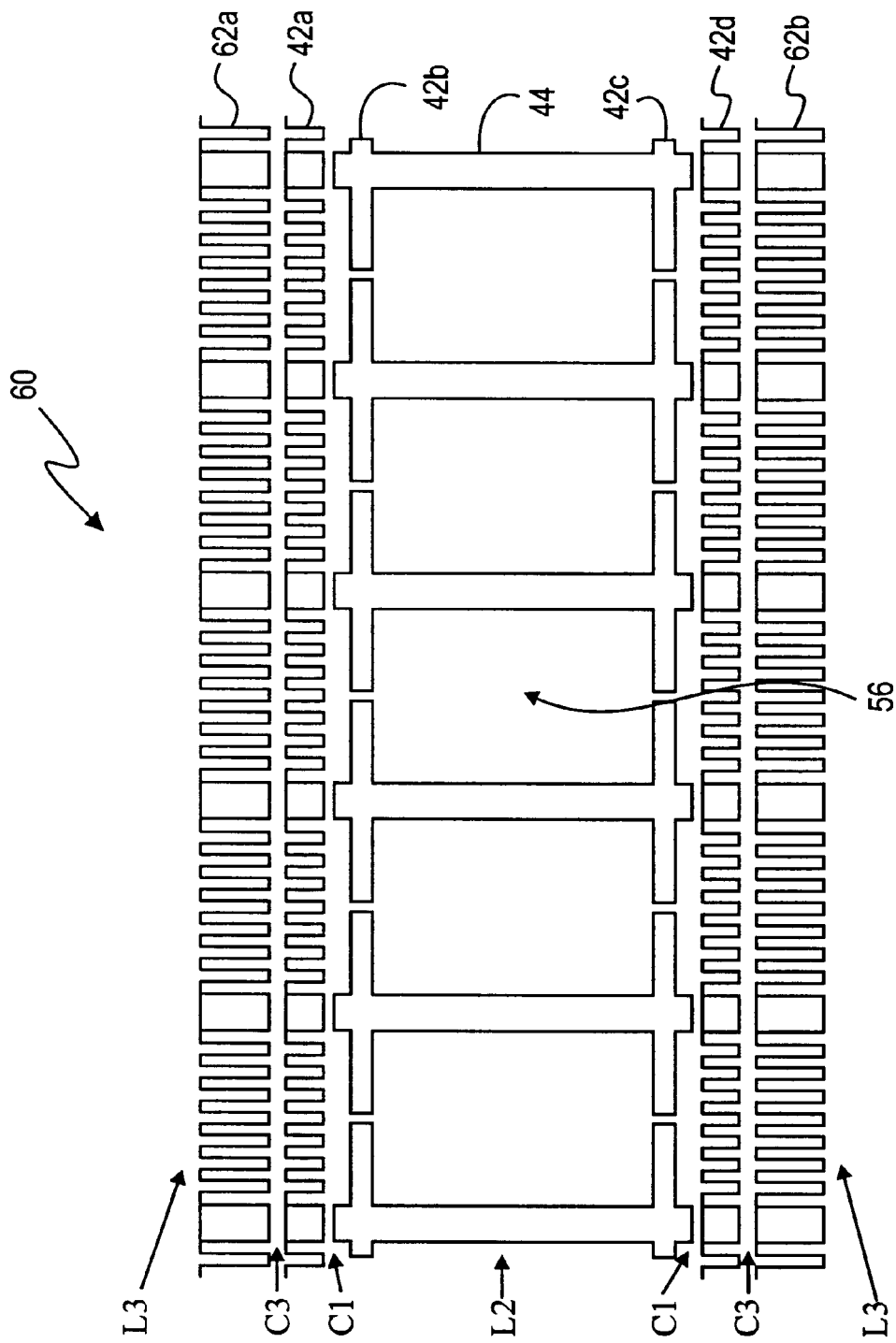

FIGS. 7a and 7b illustrate another embodiment of the present invention. FIG. 7a illustrates a schematic diagram of the electrical circuit equivalent for a triple-tune bird cage coil 60, and FIG. 7b illustrates a portion of the artwork for the triple-tune bird cage coil 60 of FIG. 7a. The triple-tuned bird cage coil 60 can be easy made by simple adding two more outer rings or annular conductors 62a and 62b to the double-tuned bird cage coil 40. The additional outer rings 62a and 62b comprise a series of inductances L3, and capacitances C3 connect the additional outer rings 62a and 62b to the outer rings 42a and 42d of the double-tuned bird cage coil, respectively. As discussed above for the double tune bird cage coil, the capacitances C3 connecting the rings 62a to 42a and 62b to 42d help balance the circuit as well as reduce the voltage across each capacitor to reduce the likelihood of arcing. Alternatively, the bird cage may be unbalanced with one of the capacitance C3 eliminated leaving only one of the additional outer rings connected 62a or 62b to the outer rings 42a or 42d through the capacitance C3 and the other connected through a conductor (not shown).

The triple-tuned bird cage coil of FIG. 7a can be understood as an additional low pass bird cage coil combined with the double-tune bird cage coil 40. The additional low pass bird cage coil comprising the additional outer rings 62a and 62b which each comprise the series inductances L3 and the legs 44 which each comprise the series combination of capacitances C3 and C1, inductance L2 and capacitances C3 and C1. The frequency of the third k1 mode depends on the inductance of the outer ring L3, the capacitor C3 between the additional outer rings 62a and 62b and the outer rings 42a and 42d, the capacitor C1 and the inductance L2. Since the current of the third frequency also flows through the inductance L2 of the shared portions of the legs 44, the triple-tuned bird cage coil 60 will have a similar magnetic field profile in the sample region 56 for all three resonant frequencies.

In one embodiment of the triple-tune bird cage coil 60 as depicted by the art work in FIG. 7b, the inductance L3 is a meander line inductor 64 with a zig-zag pattern as discussed above. Because the meander line inductance has a compact structure and may provide a large range of inductance values, the meander line inductor 64 may be easily added to the double-tune bird cage coil 40 described above. Because of the flexibility of the meander line inductor, larger inductance values may be provided for the outer rings 62a and 62b by varying the width and/or number of zig-zag turns.

A multiple-tuned bird cage coil may be designed by extending the basic concept of adding additional outer inductance rings to the bird cage coil 40 as demonstrated by the triple-tune bird cage coil 60. A balanced N frequency bird cage coil requires 2N end-rings. Capacitors $C_N$ would connect the additional outer rings to adjacent outer rings. Because the currents of the N frequencies all flow through the inductance L2 of the shared portions of the legs 44, the N frequencies bird cage coil will have a similar magnetic field profile in the sample area for all N resonant frequencies. Additionally, each frequency preserves its quadrature property.

Although the triple-tuned bird cage coil 60 is illustrated as a single layer structure as shown in FIGS. 7a and 7b, the triple-tuned bird cage coil 60 and other multiple-tune bird cage coils may be stacked up into a multi-layer structure. The single layer structure allows easier manufacturing through etching with easier art work.

While particular embodiments and applications of the present invention have been illustrated and described, it is to be understood that the invention is not limited to the precise construction and compositions disclosed herein and that various modifications, changes, and variations will be apparent from the foregoing descriptions without departing from the spirit and scope of the invention as defined in the appended claims.

What is claimed is:

1. A multiple tuned bird cage coil for providing a substantially uniform RF field in a cylindrical sample area of said coil and exhibiting at least two fundamental resonant frequencies comprising:

a plurality of leg conductors disposed spaced from an axis; and at least three annular conductors disposed about said axis and coupled to said leg conductors to define said cylindrical sample area with said leg conductors, said annular conductors and said leg conductors defining a low pass bird cage coil sharing a portion of each of said leg conductors with a high pass bird cage coil such that a higher frequency current and a lower frequency current flow through said shared portion of each of said leg conductors to provide said substantially uniform RF field in said cylindrical sample area, wherein said high pass bird cage coil comprises a first and a second inner annular conductor each comprising a series of annular capacitances, said inner annular conductors being connected to each other by said shared portion of said leg conductors, said low pass bird cage coil comprising first and second outer annular conductors, each comprising a series of annular inductances, said outer annular conductors being connected to each other by said leg conductors, said leg conductors comprising said shared portion of said leg conductors and a leg capacitance, said shared portion of said leg conductor comprising a leg inductance, whereby said higher resonant frequency and said lower resonant frequency are independently tuned.

2. The multiple tuned bird cage coil of claim 1 wherein said annular inductances are meander line inductors.

3. The multiple tuned bird cage coil of claim 2 wherein said meander line inductors have a zig-zag pattern.

4. The multiple tuned bird cage coil of claim 1 further including a third and a fourth outer annular conductor comprising a series of inductances, said third outer annular conductor connected to said first outer annular conductor through a second leg capacitance on said leg conductors, said fourth outer annular conductor being connected to said second outer annular conductor.

5. The multiple bird cage coil of claim 1 wherein said bird cage has a single layer structure, said annular conductors having substantially similar diameters.

6. The multiple bird cage coil of claim 1 wherein said bird cage has a multi-layer structure.

7. The multiple tuned bird cage coil of claim 1 wherein said high pass bird cage coil comprises a first inner annular conductor comprising a series of annular capacitances and lower inner annular conductor connected to each other by said shared portion of said leg conductors, said low pass bird cage coil comprising a second inner-annular conductor comprising a series of annular inductances and said lower inner annular conductor, said second outer annular conductor being connected to said lower inner annular conductor by said leg conductors, said leg conductors comprising said shared portion of said leg conductors and a leg capacitance, said shared portion of said leg conductor comprising a leg inductance.

8. The multiple tuned bird cage coil of claim 7 further including a second outer annular conductor comprising a series of inductances, said second outer annular conductor connected to said first outer annular conductor through a second leg capacitance on said leg conductors.

9. An independently double tuned bird cage coil for providing a substantially uniform RF field in a cylindrical sample area of said coil and exhibiting a higher and a lower fundamental resonant frequency comprising:

a plurality of leg conductors disposed spaced from an axis; and a first and a second inner ring conductor and a first and a second outer ring conductor disposed about said axis and coupled to said leg conductors to define said cylindrical sample area with said leg conductors, each said first and said second inner ring conductor comprising a series of ring capacitances, said inner ring conductors being connected to each other by a leg inductance of each of said leg conductors, said first and said second outer ring conductor comprising a series of ring inductances, said first outer ring conductor connected to said first inner ring conductor by a first leg capacitance on each of said leg conductors and said second inner ring conductor connected to said second outer ring conductor by a second leg capacitance on each of said leg conductors, wherein both a higher frequency current and a lower frequency current at said higher and lower fundamental frequencies flow through said leg inductance to generate said field.

10. The independently double tuned bird cage coil of claim 9 wherein said lower resonant frequency is tuned by adjusting said leg capacitances and said higher resonant frequency is tuned by adjusting said ring capacitances.

11. The independently double tuned bird cage coil of claim 9 wherein said ring inductance comprises a meander line inductor.

12. The independently double bird cage coil of claim 11 wherein said meander line inductor has a zig-zag pattern.

13. The independently double tuned bird cage coil of claim 9 further including a third and a fourth outer ring conductor comprising a series of second ring inductances, said third outer ring conductor connected to said first outer ring conductor through a second leg capacitance on each of said leg conductors, said fourth outer ring conductor being connected to said second outer ring conductor through a third leg capacitance on each of said leg conductors.

14. The bird cage coil of claim 13 wherein a third fundamental resonant frequency is exhibited.

15. The independently tuned double bird cage coil of claim 9 wherein said bird cage has a single layer structure, said ring conductors having substantially similar diameters.

16. The independently tuned double bird cage coil of claim 9 wherein said bird cage has a multi-layer structure.

17. An improved bird cage coil of the type that provides a substantially uniform RF field in a cylindrical sample volume of said coil and exhibits at least one fundamental resonant frequency of the type containing a plurality of leg conductors and at least two ring conductors coupled to adjacent said leg conductors for defining said cylindrical sample area, said leg and ring conductors having inductances wherein the improvement comprises:

a meander line inductor comprising said ring inductance.

18. The improvement of claim 17 wherein said meander line inductance has a zig-zag pattern.

19. The improvement of claim 17 wherein said leg inductance is a meander line inductor.

20. The improvement of claim 17 wherein in said bird cage coil is a multiple tuned bird cage coil for exhibiting at least two fundament resonant frequencies.

21. The improvement of claim 17 wherein said bird cage coil is a single tuned bird cage coil for exhibiting one fundament resonant frequency.

22. An NMR apparatus comprising a magnet for producing a magnetic field of desired spatial dependence, disposed within said magnetic field a bird cage coil of the type that provides a substantially uniform RF field in a cylindrical sample volume of said coil and exhibits at least one fundamental resonant frequency said birdcage coil comprising a plurality of leg conductors and at least two ring conductors coupled to adjacent said leg conductors for defining said cylindrical sample area, said leg and ring conductors having inductances, wherein at least one said ring inductor comprises a meander line.

* * * * *